(12) United States Patent
Daamen et al.

(10) Patent No.: US 9,281,239 B2
(45) Date of Patent: Mar. 8, 2016

(54) BIOCOMPATIBLE ELECTRODES AND METHODS OF MANUFACTURING BIOCOMPATIBLE ELECTRODES

(75) Inventors: Roel Daamen, Herkenbosch (NL); Matthias Merz, Leuven (BE)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 13/126,057

(22) PCT Filed: Oct. 26, 2009

(86) PCT No.: PCT/IB2009/054736
§ 371 (c)(1),
(2), (4) Date: Apr. 26, 2011

(87) PCT Pub. No.: WO2010/049881
PCT Pub. Date: May 6, 2010

(65) Prior Publication Data
US 2011/0207239 A1    Aug. 25, 2011

(30) Foreign Application Priority Data

Oct. 27, 2008  (EP) .................................... 08105674

(51) Int. Cl.
*H01L 21/4763* (2006.01)
*H01L 21/768* (2006.01)
*H01L 21/3213* (2006.01)

(52) U.S. Cl.
CPC .... *H01L 21/76849* (2013.01); *H01L 21/32134* (2013.01); *H01L 21/7684* (2013.01); *H01L 21/76883* (2013.01)

(58) Field of Classification Search
CPC .... B82Y 10/00; B82Y 30/00; H01L 21/3212; H01L 21/31053; H01L 21/7684; H01L 21/76807; H01L 21/76802; H01L 21/76843; H01L 21/76877
USPC ............. 438/1, 618, 625, 691, 692, 584, 622, 438/631, 633, 637, 643, 645
See application file for complete search history.

(56) References Cited

U.S. PATENT DOCUMENTS 6,001,269 A *  12/1999  Sethuraman et al. ........... 216/89
6,184,124 B1 *   2/2001  Hasegawa et al. ............ 438/625

(Continued)

FOREIGN PATENT DOCUMENTS

WO         00/75982 A1    12/2000

OTHER PUBLICATIONS

Eversmann, Bjorn, et al.; "A 128 × 128 CMOS Biosensor Array for Extracellular Recording of Neural Activity"; IEEE Journal of Solid-State Circuits, vol. 38, No. 12; pp. 2306-2317 (Dec. 2003).

(Continued)

*Primary Examiner* — Lex Malsawma
*Assistant Examiner* — Eric Jones

(57) ABSTRACT

A biocompatible electrode is manufactured by depositing filling metal 36 and etching back the filling metal to the surface of the surrounding insulator 30. Then, a further etch forms a recess 38 at the top of the via 32. An electrode metal 40 is then deposited and etched back to fill the recess 38 and form biocompatible electrode 42. In this way, a planar biocompatible electrode is achieved. The step of etching to form the recess may be carried out in the same CMP tool as is used to etch back the filling metal 36. A hydrogen peroxide etch may be used.

17 Claims, 9 Drawing Sheets

(56) References Cited

U.S. PATENT DOCUMENTS

| | | | |
|---|---|---|---|
| 6,211,087 B1* | 4/2001 | Gabriel et al. | 438/691 |
| 6,251,786 B1* | 6/2001 | Zhou et al. | 438/692 |
| 6,261,953 B1* | 7/2001 | Uozumi | 438/687 |
| 6,274,499 B1* | 8/2001 | Gupta et al. | 438/692 |
| 6,376,353 B1* | 4/2002 | Zhou et al. | 438/612 |
| 6,492,271 B1 | 12/2002 | Uozumi et al. | |
| 6,670,274 B1* | 12/2003 | Liu et al. | 438/692 |
| 6,764,950 B2* | 7/2004 | Noguchi | H01L 21/02063 257/E21.576 |
| 7,060,619 B2* | 6/2006 | Cowley et al. | 438/687 |
| 7,071,564 B1* | 7/2006 | Erb et al. | 257/774 |
| 2003/0228830 A1* | 12/2003 | Sakai | 451/8 |
| 2004/0154931 A1* | 8/2004 | Hongo | B23H 5/08 205/676 |
| 2004/0175921 A1* | 9/2004 | Cowley et al. | 438/622 |
| 2006/0157857 A1* | 7/2006 | Lane et al. | 257/758 |
| 2006/0160349 A1* | 7/2006 | Wong et al. | 438/618 |
| 2006/0170106 A1* | 8/2006 | Tseng et al. | 257/760 |
| 2006/0172528 A1* | 8/2006 | Lee | 438/633 |
| 2007/0007653 A1* | 1/2007 | Chen et al. | 257/751 |
| 2007/0072311 A1* | 3/2007 | Wilson et al. | 438/3 |

OTHER PUBLICATIONS

Hofmann, Franz, et al.; "Technology Aspects of a CMOS Neuro-Sensor: Back End Process and Packaging"; 33$^{rd}$ Conference on European Solid-State Device Research; pp. 167-170; (Sep. 2003).

International Search Report for Application PCT/IB2009/054736 (Feb. 4, 2010).

* cited by examiner

BIOCOMPATIBLE ELECTRODES AND METHODS OF MANUFACTURING BIOCOMPATIBLE ELECTRODES

The invention relates to biocompatible electrodes and to a method of making them.

Electrodes for biological applications increasingly need to be included in semiconductor devices manufactured with modern semiconductor processing, especially complementary metal oxide semiconductor (CMOS) devices manufactured using CMOS processing techniques.

An existing process for manufacturing an electrode for a biosensor is described in Eversmann et al, CMOS Biosensor Array for Extracellular Recording of Neural Activity, IEEE Journal of Solid-State Circuits, volume 38 number 12 (December 2003), After completing a standard CMOS process to form devices, two metal layers, with a nitride passivation and a tungsten via, an additional process is used to form the additional sensor electrode. The surface is planarised, and a 50 nm thick Ti/Pt stack is deposited and patterned using a liftoff process. The stack is used both as the sensor electrodes and as an adhesion layer for the bond pads. A 40 nm sensor dielectric of $TiO_2$, $ZrO_2$, $TiO_2$, $ZrO_2$, and $TiO_2$ is formed by sputtering to protect the biocompatible electrode. The sensor dielectric is removed over the bond pads.

An alternative process for the manufacture of electrodes is proposed in Franz Hofmann et al, Technology Aspects of a CMOS Neuro-Sensor: Back End Process and Packaging, 33rd European conference on European Solid-State Device Research, 2003, 16-18 Sep. 2003, pages 167 to 170.

In this process, the conventional CMOS process is used and ends with a nitride passivation layer over a silicon dioxide layer. Then, to manufacture the electrodes a via is formed to the top layer of metallization, and filled with a Ti/TiN barrier layer and tungsten. Then, a CMP process is used to etch back to the nitride passivation layer. A Cr adhesion layer is followed by a Pt electrode layer and patterned using a lift-off process. $TiO_2$ and/or $ZrO_2$ are then deposited by sputtering. At the contact pads, but not the biocompatible electrodes, the $TiO_2$ is etched away and a gold contact evaporated.

A downside with both of these processes is that additional lithography and etching steps are required to manufacture the biocompatible electrodes which leads to expensive manufacturing costs.

Further, the use of some metals are not compatible with modern CMOS processing. This applies in particular to platinum and gold. In particular, processing using platinum is normally only possible in older fabs intended for bipolar processing with wafer diameters up to 6 inch.

Accordingly, there is a need for alternative processes for manufacturing biocompatible electrodes which is compatible with CMOS processing.

According to the invention there is provided a method according to claim 1.

By using the method according to the invention, the biocompatible electrode is formed with no lithography steps at all (after forming the via) and so the process is cheaper than those proposed before.

The inventors have realized that a further problem occurs with the lithography step used to pattern the biocompatible electrode in the prior art approaches discussed above. If the lithography is slightly misaligned with the contact then some of the contact may be exposed after the manufacture of the electrode which can lead to contamination issues. In contrast, using the method proposed, the method is self aligned. This minimises contamination and overlay issues.

The method is compatible with modern CMOS processes, including both processes with copper-based interconnects and aluminium-based interconnects.

A further benefit is that the electrode is completely planar. This avoids stress at corners where subsequent dielectrics are deposited, improving reliability.

The invention also relates to a semiconductor device according to claim 6.

Embodiments of the invention will now be described, purely by way of example, with reference to the accompanying drawings, in which.

The figures are not to scale. Like or similar components are given the same reference numbers in the different Figures, and the corresponding description is not repeated.

Figure 1:
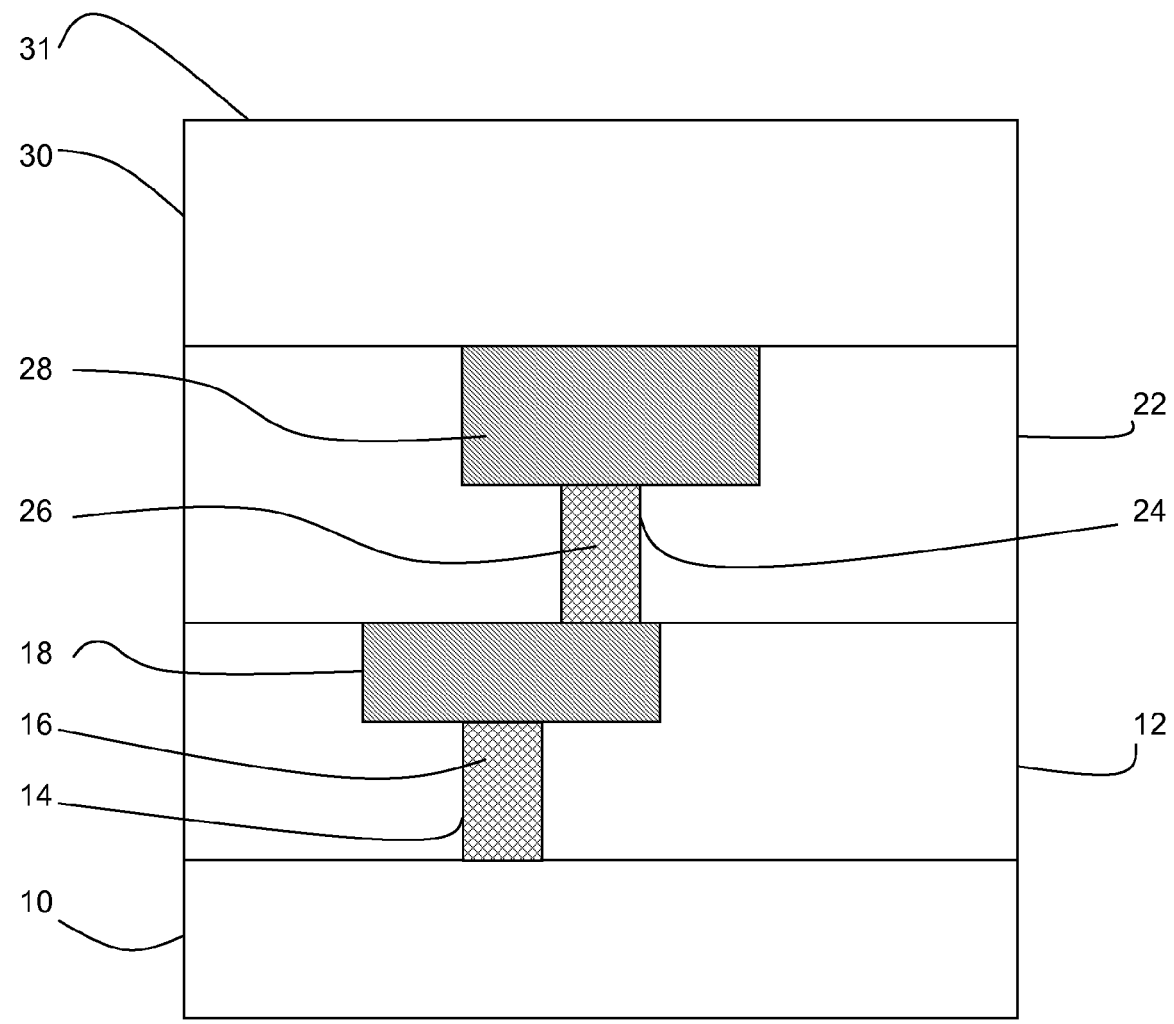
FIGS. 1 to 6 illustrate steps in the manufacture of a semiconductor device according to a first embodiment of the invention.

Referring to FIG. 1, a conventional CMOS process results in a semiconductor device having a substrate 10 with transistors and other devices formed within and on it. For clarity, these are not shown.

A number of interconnection layers are then formed. A first interconnection layer is formed of insulator 12, typically silicon dioxide, having a via 14 formed through the insulator filled with a plug 16, here tungsten. A first layer of aluminium interconnect 18 is provided above the plug 16. The aluminium interconnect 18 extends across the substrate 10.

Similarly, a second interconnection layer is formed in the same way, namely with insulator 22, via 24, plug 26 and interconnect 28. In the embodiment, the interconnect 28 in the second layer is the highest level of interconnect and so will be referred to as the upper interconnect layer.

A passivation layer 30 is then formed over the second interconnection layer with upper surface 31. The passivation layer 30 is insulating, and may be of silicon dioxide, silicon nitride, silicon carbide or a combination. In the preferred embodiment, the passivation layer is in fact a stack of SiC, followed by $SiO_2$ followed by $Si_3N_4$; this stack may be referred to as the passivation stack. This results in the arrangement shown in FIG. 1.

Figure 2:
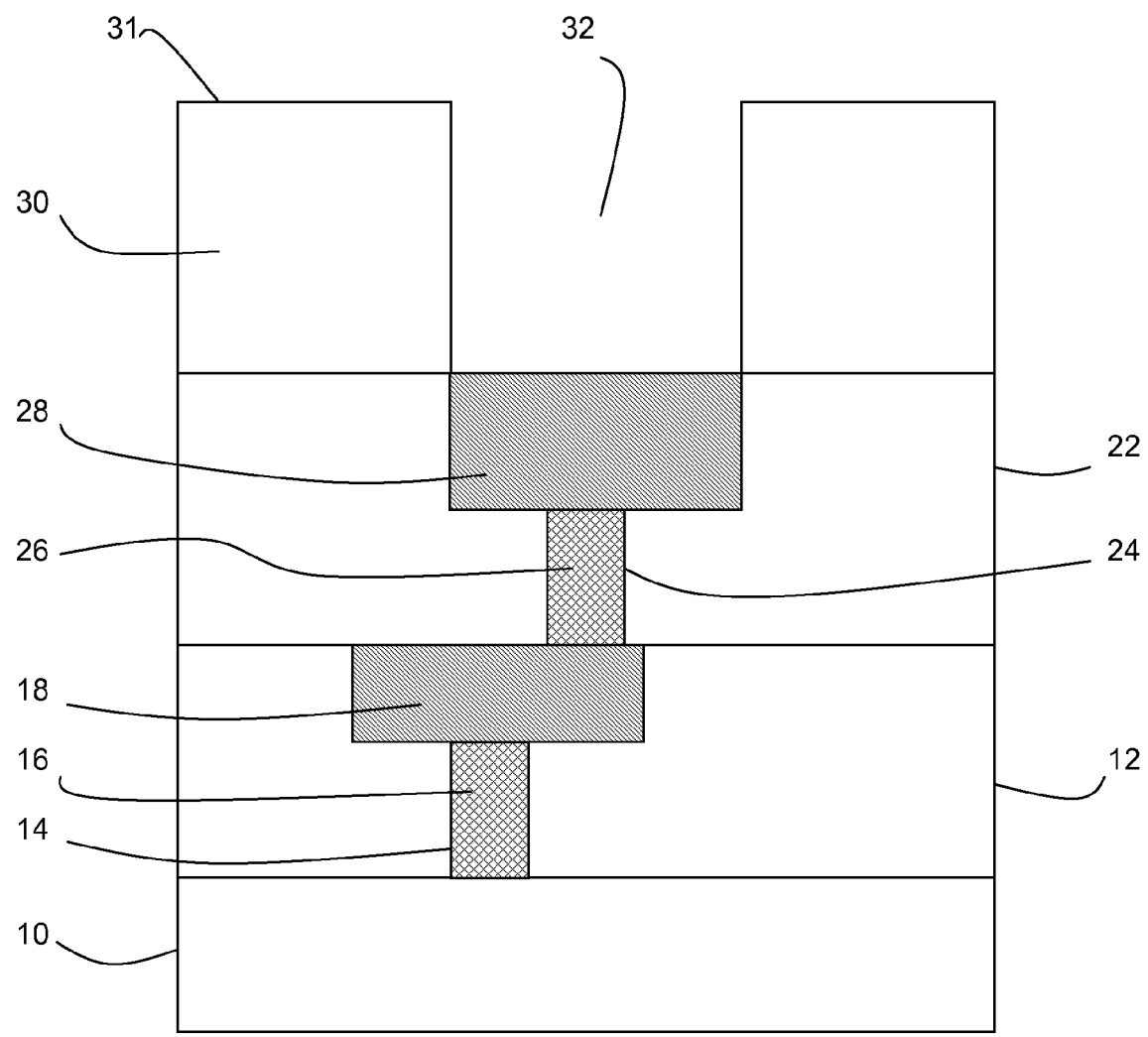

Processing to form the biocompatible electrode then begins by forming a via 32 through the passivation layer to the upper interconnect layer 28. This involves a lithographic step, to define the via. Typically, photoresist may be deposited and patterned to expose part of the passivation layer and a dry etching step carried out to etch through to the aluminium. Then, the photoresist is removed, as illustrated in FIG. 2.

A barrier layer 34 is then deposited over the whole surface of passivation layer 30 and in the via 32, using a process with good step coverage. The barrier layer 34 may be, for example a Ti/TiN barrier layer or a Ti/W barrier layer, both of which are fully compatible with CMOS processing.

Figure 3:
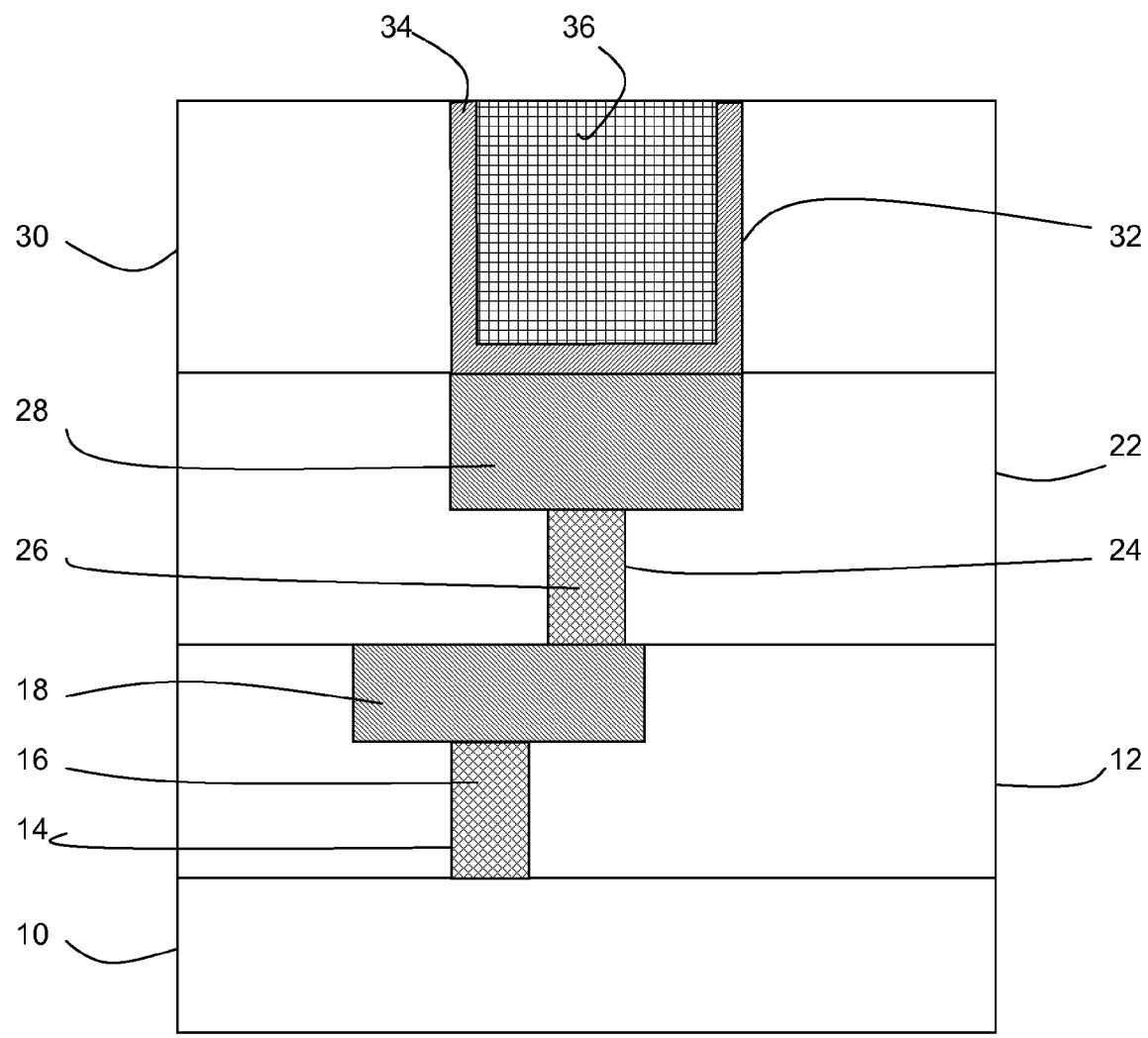

Then, filling metal 36, in the embodiment tungsten, is deposited over the whole surface, including in the via 34. A conventional chemical mechanical polishing (CMP) step using a CMP tool then planarises the surface by etching and polishing away the filling metal 36 and barrier layer 34 above the passivation layer 30, leaving the barrier layer 34 and filling metal present only in the via. This step leaves the top of the filling metal plug 36 level with the top of the passivation layer 30 as illustrated in FIG. 3.

Figure 4:
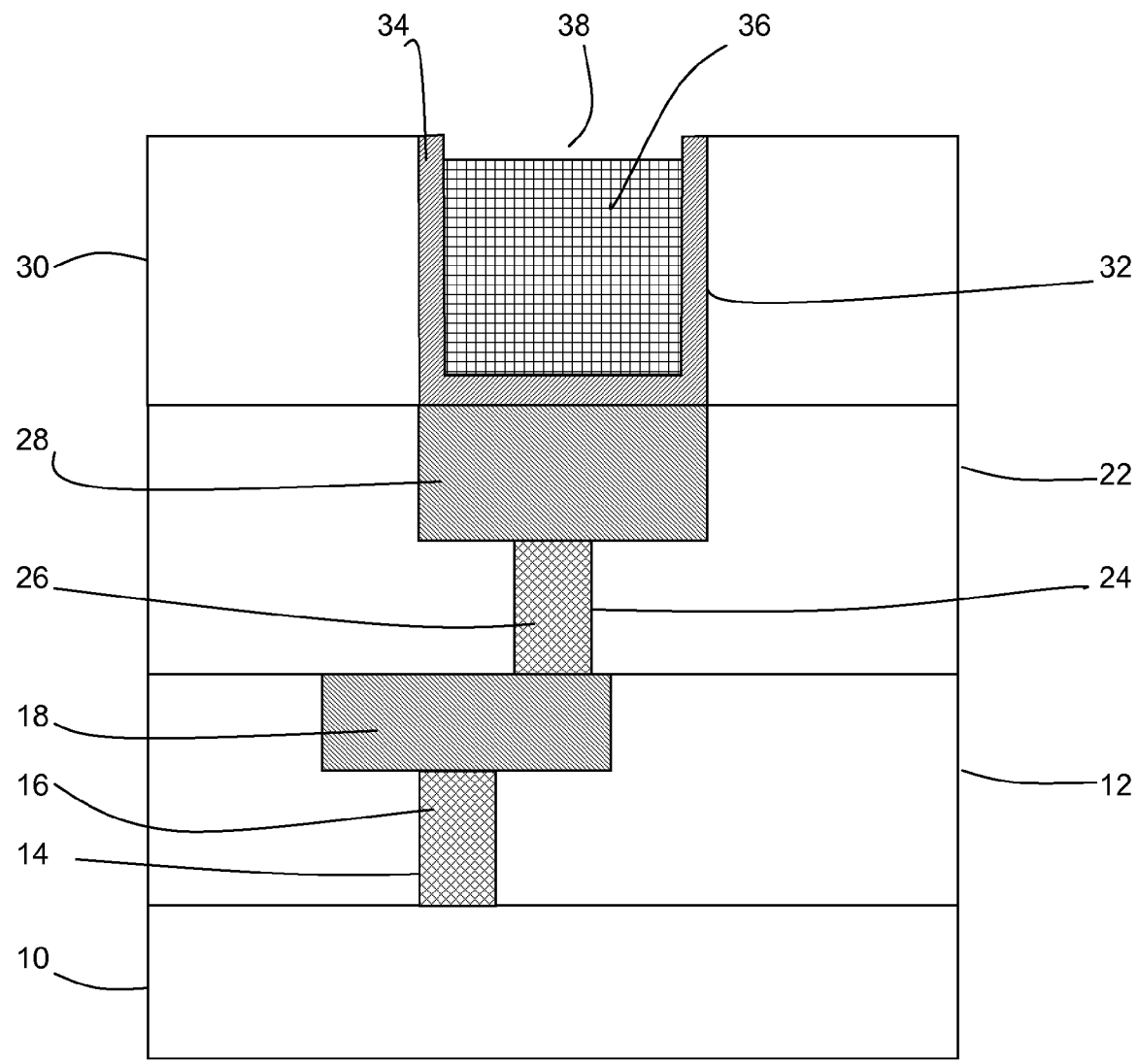

A further selective etch is then carried out to etch away the filling metal in the via, creating a recess 38 as illustrated in FIG. 4, below the level of the upper surface 31. In this embodiment, the selective etch does not etch away the barrier layer 34.

The particular etch selected in the embodiment is a $H_2O_2$ (hydrogen peroxide) etch. Normally, this would give a low etch rate which would reduce the process speed excessively. However, in the embodiment the $H_2O_2$ is supplied in the CMP tool previously used for the CMP step. The use of the CMP tool allows constant fresh $H_2O_2$ to be delivered to the surface of the wafer and allows constant removal of the dissolved W. The inventors have accordingly been able to achieve etch rates of 90 nm/min and up using this $H_2O_2$ etch, much higher than would be expected by a conventional wet etch step using $H_2O_2$. Moreover, the use of the same tool as in the previous step is extremely efficient since it does not require moving the device at all.

Further, note that by avoiding a dry etch at this stage there is no risk of damaging the dielectric in the passivation layer 30.

Figure 5:
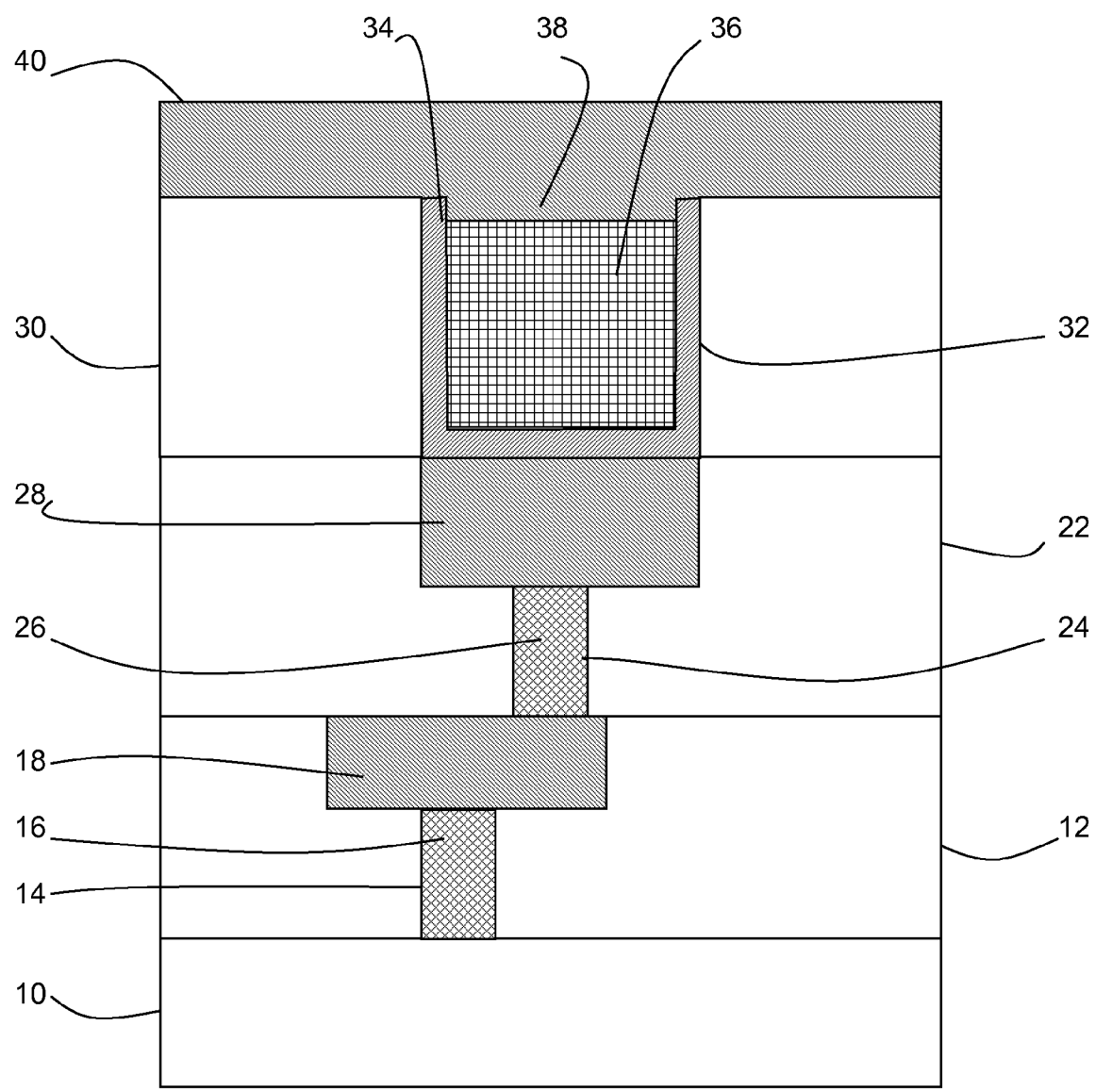

Next, the electrode metal 40 is deposited over the full surface of the device, including over the passivation layer 30 and in the recess 38, as illustrated in FIG. 5. The electrode metal may be a single layer, for example of Ta or Ti, a nitride for example TaN or TiN, or a multilayer for example Ta/TaN or Ti/TiN.

Figure 6:
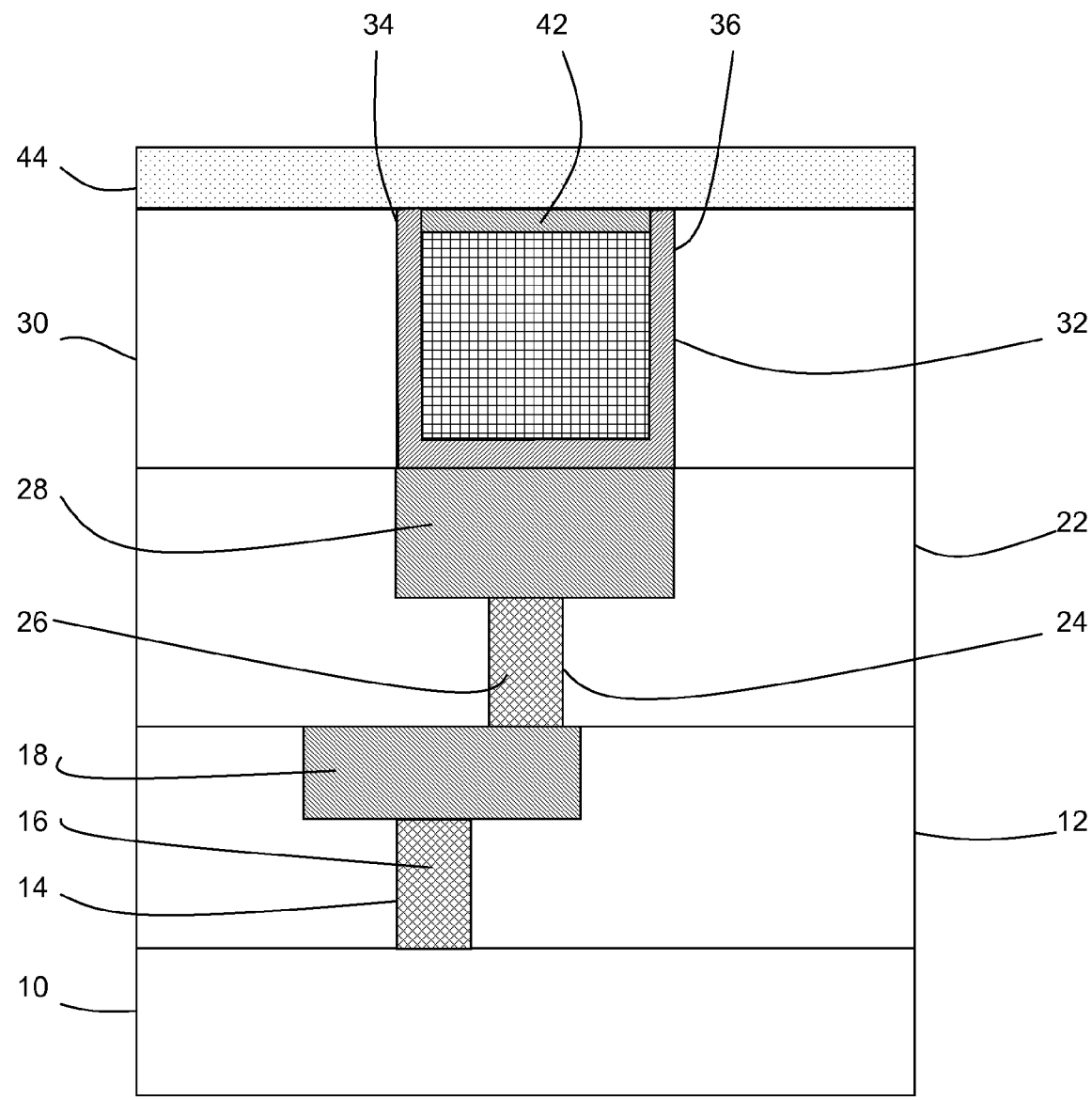

After depositing the electrode metal 40 another CMP process is used to etch and/or polish away the electrode metal 40 from above the passivation layer 30 and hence to leave the electrode metal only in the recess 38 at the top of the via, flush (level) with the surface of the passivation layer 30 as shown in FIG. 6, forming the finished electrode 42.

A biocompatible dielectric layer 44 is then deposited over the complete surface. The dielectric layer may be, for example, of $TiO_2$, $Ta_2O_5$, $SiO_2$, SiN or $HfO_2$ or combinations of these or other materials.

Thus, a damascene process is used to form the biocompatible electrode in the recess at the top of the via. This process is a self-aligned process and this therefore ensures that the electrode 42 has exactly the same dimensions as the underlying W contact. This avoids the possibility of contamination caused by misalignment of the biocompatible electrode and the plug.

The possibility of avoiding the use of Au and Pt enables integration of the method on existing CMOS processing fabs, including those using copper interconnect.

Figure 7:
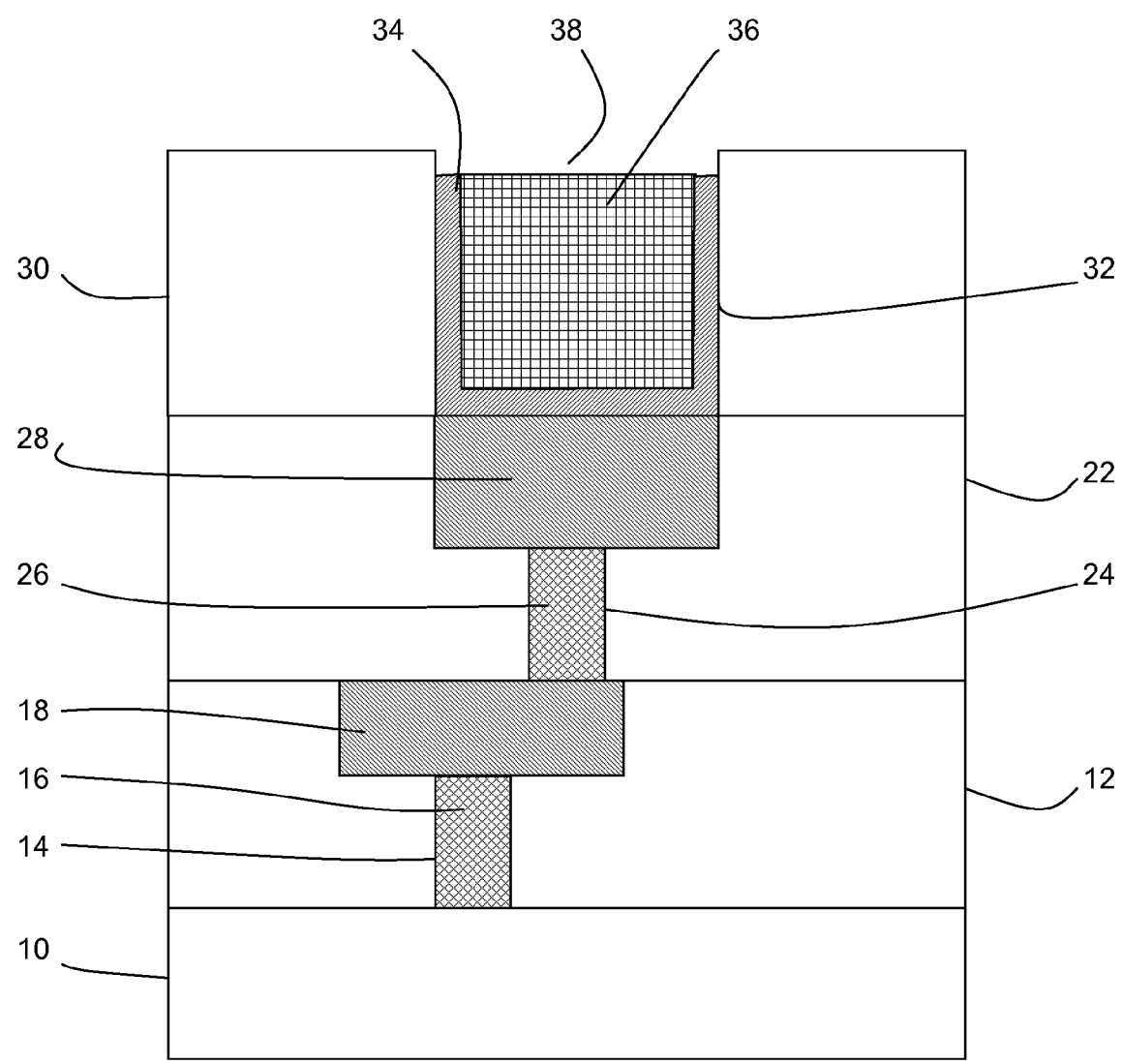
FIGS. 7 and 8 illustrate steps in the manufacture of a semiconductor device according to a second embodiment of the invention.
Figure 8:
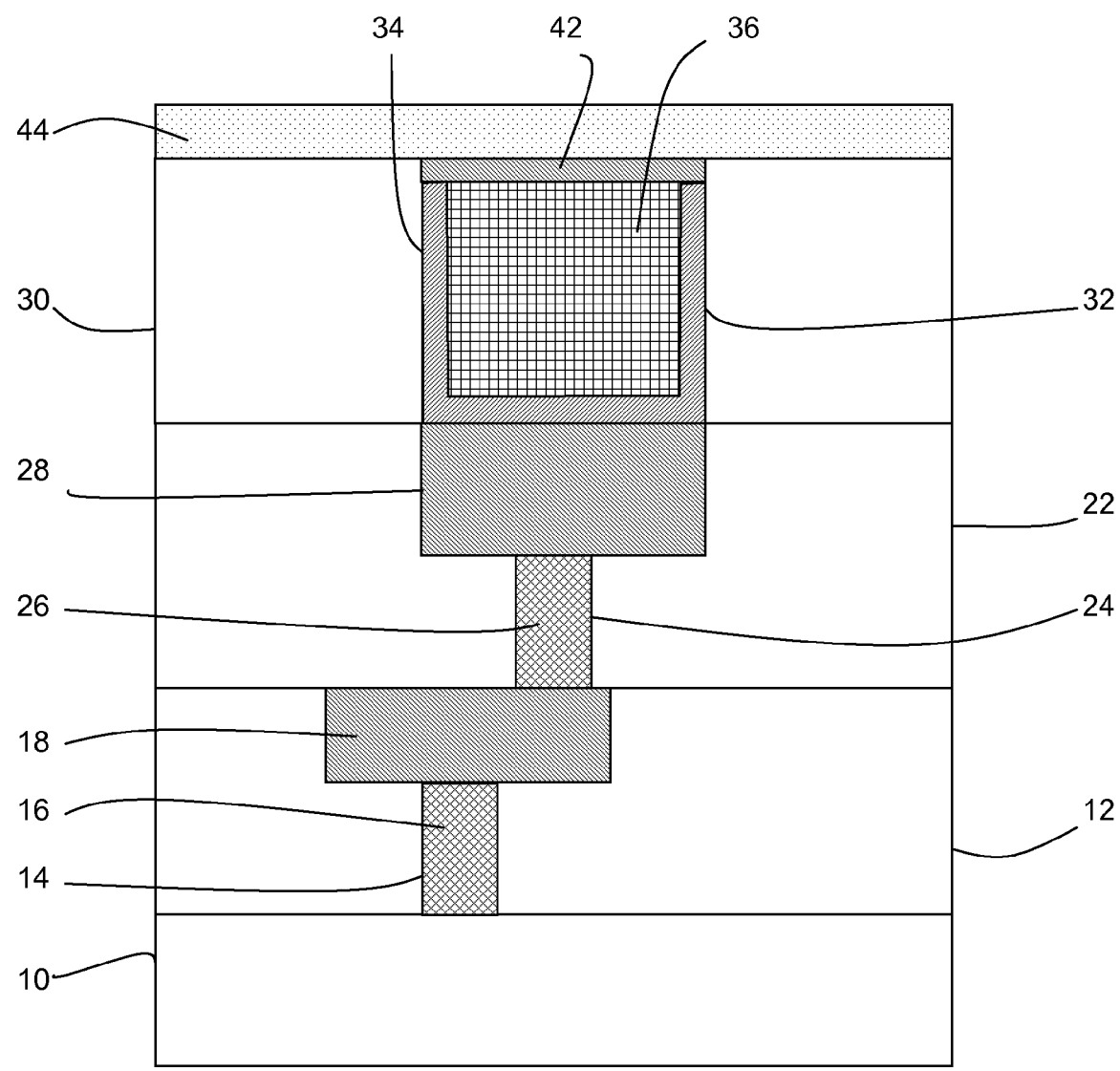

FIGS. 7 and 8 illustrate a second embodiment. The method of manufacturing a semiconductor device according to the second embodiment proceeds in the same way as in the first embodiment to the stage illustrated in FIG. 3.

The next step is to carry out a selective etch to form recess 38, but in the process illustrated with reference to FIGS. 7 and 8 the selective etch etches both the barrier layer 34 and the filling metal 36 to form recess 38.

Processing then proceeds as in the first embodiment to form electrode 42 and dielectric 44 to result in the finished semiconductor device illustrated in FIG. 8.

The embodiments describe above relate to semiconductor devices using aluminium interconnect. However, the invention is also applicable to CMOS devices using other forms of interconnect, such as copper.

Figure 9:
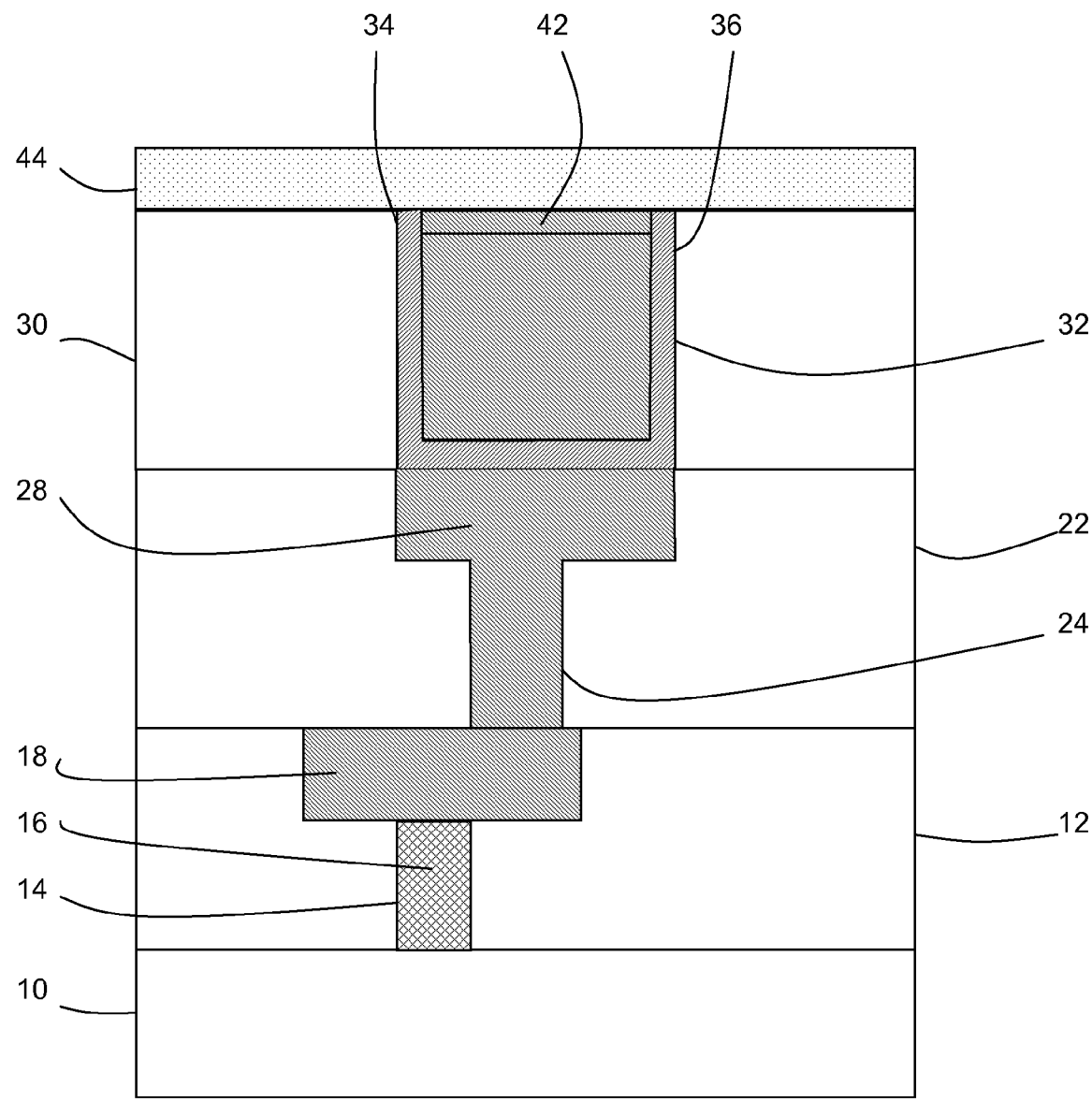
FIG. 9 illustrates a semiconductor device according to a third embodiment of the invention.

FIG. 9 illustrates a third embodiment using a copper interconnect. In this embodiment, the manufacture proceeds essentially as in the embodiment of FIGS. 1 to 6, except that the material of the first and second interconnects 18, 28 is copper. Note however one difference; the second interconnect 28 is used to fill additionally the second via 24 and there is no separate plug in the second interconnect layer (this is the so-called dual damascene processing).

In the embodiment illustrated in FIG. 9, the material of the filling metal 36 is also copper. In this case, the choices for the barrier layer 34 include not merely Ti or TiN but Ta, or TaN/Ta.

Although in the FIG. 9 embodiment a Cu filling metal 36 is used with copper interconnects, other possibilities for filling metal 36 exist, such as tungsten.

The above embodiments are all described with reference to a semiconductor device with two metallisation layers. However, the invention is equally applicable to semiconductor devices with only a single metallisation layer, as well as to semiconductor devices with more than two metallisation layers.

The invention claimed is:

1. A method of manufacturing a biocompatible electrode on a semiconductor device having a dielectric layer above at least one metallisation layer, the method comprising:
    etching a via in the dielectric layer and therein exposing the metallisation layer with via sidewalls extending from the metallisation layer;
    depositing filling metal in the via;
    etching back the filling metal using a non-electropolishing chemical mechanical polishing tool to remove the metal from and expose a top surface of the dielectric layer via chemical mechanical polishing and to leave the metal in the via level with the top surface of the dielectric layer;
    after etching back the filling metal and exposing the top surface and without moving the semiconductor device between chambers of a single etching apparatus comprising the non-electropolishinq chemical mechanical polishing tool, carrying out a further etch to etch back the filling metal in the via to form a recess in the filling metal within the via, by supplying a constant flow of hydrogen peroxide from the chemical mechanical polishing tool into the recess and using the hydrogen peroxide to both wet etch the filling metal and remove portions of the filling metal dissolved during the etch from the recess, the recess in the filling metal having recess sidewalls inset from the via sidewalls;
    depositing an electrode metal over the top surface of the dielectric layer and in the recess in the via; and
    etching back the electrode metal using chemical mechanical polishing to remove the electrode metal from the surface of the dielectric layer and to leave the electrode metal in the via to form the biocompatible electrode, and depositing a biocompatible-dielectric layer over the electrode metal and covering the top surface of the dielectric layer.

2. A method according to claim 1, further including forming a barrier layer in the via by depositing a barrier layer therein and abutting the via sidewalls and a top surface of the metallization layer, and wherein supplying the wet etch solution includes constantly supplying a solution of hydrogen peroxide and accelerating a rate at which the metal in the via is wet etched via constant introduction of fresh hydrogen peroxide to a surface of the metal in the via while removing hydrogen peroxide that has reacted with the metal to effect the etching.

3. A method according to claim 1, further including forming a barrier layer in the via by depositing a barrier layer therein and abutting the via sidewalls and a top surface of the metallization layer, and wherein the step of depositing the biocompatible-dielectric layer includes depositing one or more of $TiO_2$, $Ta_2O_5$ $SiO_2$, SiN or $HfO_2$ and the top surface of the metallization layer is level with a bottom surface of the dielectric layer.

4. A method according to claim 1, further including forming a barrier layer in the via by depositing a barrier layer therein and abutting the via sidewalls and a top surface of the metallization layer, and wherein the electrode metal is of at least one of Ta, Ti, TaN and TiN, and depositing the filling metal includes depositing the filling metal on the barrier layer and to the top surface of the dielectric layer.

5. A method according to claim 1 wherein the at least one metallisation layer is of copper or an alloy of copper and the filling metal is tungsten or copper.

6. A method according to claim 1 wherein the at least one metallisation layer is of aluminium or an alloy of aluminium and the filling metal is tungsten.

7. The method according to claim 1, wherein the step of carrying out the further etch includes etching at a rate of approximately 90 nm/min, while supplying the hydrogen peroxide to remove portions of the filling metal at the rate at which the filling metal is dissolved.

8. A method according to claim 1, wherein the steps of etching back the filling metal using chemical mechanical polishing to remove the metal from a top surface of the dielectric layer, and carrying out a further etch to etch back the filling metal in the via, respectively include continuously engaging a chemical mechanical polishing tool to
 planarize the filling metal with the top surface by polishing the filling metal with a chemical mechanical polishing tool, and
 after the filling metal is planar with the top surface, supplying the hydrogen peroxide via the chemical mechanical polishing tool to etch back the filling metal to form a recess offset from the top surface.

9. A method according to claim 8, wherein planarizing the filling metal includes polishing the filling metal with the chemical mechanical polishing tool until the tool is in contact with the top surface and maintaining the tool in contact with the top surface while supplying the hydrogen peroxide and carrying out the further etch.

10. A method according to claim 8, further including forming a barrier layer in the via by depositing a barrier layer along sidewalls of the via, wherein depositing the filling metal includes depositing the filling metal within the barrier layer of the via, and wherein the steps of etching back the filling metal and carrying out a further etch back include etching both the barrier layer and the filling metal.

11. A method according to claim 8, further including forming a barrier layer in the via by depositing a barrier layer along sidewalls of the via, wherein depositing the filling metal includes depositing the filling metal within the barrier layer of the via, and wherein the steps of etching back the filling metal and carrying out a further etch back include selectively etching the filling metal, relative to the barrier layer.

12. A method according to claim 1, wherein carrying out the further etch includes terminating operation of the chemical mechanical polishing tool while maintaining the chemical mechanical polishing tool in place, whereat the constant flow of hydrogen peroxide is provided from the chemical mechanical polishing tool to a surface of the filling metal.

13. A method of manufacturing a biocompatible electrode on a semiconductor device having a passivating layer above at least one metallization layer, the method comprising:
 etching a via in the passivating layer to expose the metallization layer;
 depositing filling metal in the via and extending over the via and on a top surface of the passivating layer;
 etching the filling metal using a non-electropolishing chemical mechanical polishing tool to remove the filling metal on the passivating layer and to planarize the filling metal in the via with the top surface of the passivating layer, therein exposing the top surface of the passivating layer;
 after exposing the top surface of the passivating layer surface and without moving the semiconductor device between chambers of a single etching apparatus comprising the non-electropolishinq chemical mechanical polishing tool, etching the filling metal in the via to form a recess in the via by supplying a flow of hydrogen peroxide using the chemical mechanical polishing tool and using the flow of hydrogen peroxide to both dissolve portions of the filling metal and remove the filling metal that has dissolved;
 depositing an electrode metal in the recess in the via and extending over the via and the top surface of the passivating layer;
 etching the electrode metal using chemical mechanical polishing to remove the electrode metal from the surface of the passivating layer in the via to form the biocompatible electrode; and
 depositing a biocompatible-dielectric layer on the electrode metal and the top surface of the passivating layer.

14. The method of claim 13, wherein the steps of etching the filling metal and etching the filling metal in the via include engaging the chemical mechanical polishing tool to planarize the filling metal with the top surface and maintaining the chemical mechanical polishing tool in contact with the top surface while supplying a constant flow of the hydrogen peroxide to a surface of the filling metal using the chemical mechanical polishing tool, and using the constant flow of hydrogen peroxide to dissolve and remove the filling metal at a rate of about 90 nm/min.

15. The method of claim 14,
 further including forming a barrier layer in the via by depositing a barrier layer along sidewalls of the via,
 wherein depositing the filling metal includes depositing the filling metal within the barrier layer of the via, and
 wherein the steps of etching the filling metal using a chemical mechanical polishing tool and etching the filling metal in the via include etching both the barrier layer and the filling metal.

16. The method of claim 14, further including forming a barrier layer in the via by depositing a barrier layer along sidewalls of the via, wherein depositing the filling metal includes depositing the filling metal within the barrier layer of the via, and wherein the steps of etching the filling metal and etching the filling metal in the via include selectively etching the filling metal, relative to the barrier layer.

17. A method according to claim 13, wherein etching the filling metal in the via includes terminating operation of the chemical mechanical polishing tool while maintaining the chemical mechanical polishing tool in place, whereat the flow of hydrogen peroxide is provided from the chemical mechanical polishing tool to a surface of the filling metal.

* * * * *